(12) United States Patent
Hayashi

(10) Patent No.: US 11,833,737 B2
(45) Date of Patent: Dec. 5, 2023

(54) IMPRINT APPARATUS, METHOD OF IMPRINTING, AND METHOD OF MANUFACTURING ARTICLE

(71) Applicant: CANON KABUSHIKI KAISHA, Tokyo (JP)

(72) Inventor: Nozomu Hayashi, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/869,257

(22) Filed: Jul. 20, 2022

(65) Prior Publication Data

US 2023/0083496 A1 Mar. 16, 2023

(30) Foreign Application Priority Data

Sep. 10, 2021 (JP) .................................. 2021-147508

(51) Int. Cl.
| | |
|---|---|
| *B29C 59/02* | (2006.01) |
| *B29C 59/00* | (2006.01) |
| *G03F 7/00* | (2006.01) |
| *G03F 9/00* | (2006.01) |
| *B29C 37/00* | (2006.01) |

(52) U.S. Cl.
CPC ............ *B29C 59/02* (2013.01); *B29C 59/002* (2013.01); *G03F 7/0002* (2013.01); *G03F 9/7042* (2013.01); *B29C 2037/90* (2013.01)

(58) Field of Classification Search
CPC ... B29C 59/02; B29C 59/002; B29C 2037/90; G03F 7/0002; G03F 9/7042
See application file for complete search history.

(56) References Cited

U.S. PATENT DOCUMENTS

| 10,018,910 | B2 | 7/2018 | Usui et al. | |
|---|---|---|---|---|
| 2015/0013559 | A1* | 1/2015 | Hayashi | G03F 7/0002 101/450.1 |
| 2015/0251348 | A1* | 9/2015 | Usui | G03F 7/0002 264/293 |
| 2016/0096313 | A1* | 4/2016 | Usui | G03F 7/0002 425/150 |
| 2021/0149297 | A1* | 5/2021 | Hayashi | G03F 7/0002 |

FOREIGN PATENT DOCUMENTS

JP 2015170815 A 9/2015

* cited by examiner

*Primary Examiner* — Jerzi H Moreno Hernandez
(74) *Attorney, Agent, or Firm* — ROSSI, KIMMS & McDOWELL LLP

(57) ABSTRACT

An imprint apparatus that forms a pattern by imprinting an imprint material on a substrate using an original, includes: an original support unit; a substrate support unit; a driving unit relatively driving the original support unit and the substrate support unit; a detection unit detecting a first alignment mark of the original and a second alignment mark of the substrate; a position adjustment unit adjusting a relative position between the original and the detection unit; and a control unit controlling the position adjustment unit to adjust a relative position between the original and the detection unit based on a position of the first alignment mark detected by the detection unit in a field of view of the detection unit during imprinting, and perform an alignment between the substrate and the original by the driving unit based on the first and second alignment marks detected by the detection unit.

8 Claims, 5 Drawing Sheets

IMPRINT APPARATUS, METHOD OF IMPRINTING, AND METHOD OF MANUFACTURING ARTICLE

BACKGROUND OF THE INVENTION

Field of the Invention

The present invention relates to an imprint apparatus, a method of imprinting, and a method of manufacturing an article.

Description of the Related Art

An imprint apparatus has been put into practical use as one of lithography techniques for mass production of magnetic storage media and semiconductor devices. The imprint technique is a method of forming a circuit pattern on a substrate such as a silicon wafer or a glass plate by bringing an original on which a fine circuit pattern is formed into contact with a resin coated on the substrate. For example, in the formation of a circuit pattern of a semiconductor device, the overlay (alignment) accuracy between a circuit pattern already formed on a substrate and a circuit pattern to be formed is very important.

In an imprint apparatus using an imprint technique, a die-by-die alignment method is employed as an alignment method between a substrate and an original. The die-by-die alignment method is a method in which a substrate-side alignment mark and an original-side alignment mark are optically detected for each imprint region on a substrate where an imprint process is performed, and a deviation in the positional relationship between the substrate and the original is corrected.

Japanese Patent Application Laid-Open No. 2015-170815 discloses a method of driving a substrate stage in alignment between a substrate and an original by reflecting a driving amount of an alignment scope for detecting an alignment mark on a driving amount of the substrate.

However, in the die-by-die alignment method in the conventional imprint apparatus, if a deviation or drift of the original occurs during imprinting, the alignment scope cannot follow the original. Therefore, there is a problem in that a measurement error occurs due to a change in the position of the alignment mark within the field of view of the alignment scope, and overlay (alignment) accuracy deteriorates.

SUMMARY OF THE INVENTION

The present invention provides an imprint apparatus that is advantageous in improving the alignment accuracy between a mold and a substrate.

According to an aspect of the present invention, an imprint apparatus that forms a pattern by imprinting an imprint material on a substrate using an original, includes: an original support unit configured to support the original; a substrate support unit having a mounting surface configured to support the substrate; a driving unit configured to relatively drive the original support unit and the substrate support unit; a detection unit configured to detect a first alignment mark of the original and a second alignment mark of the substrate; a position adjustment unit configured to adjust a relative position between the original and the detection unit; and a control unit configured to control the position adjustment unit to adjust a relative position between the original and the detection unit based on a position of the first alignment mark detected by the detection unit in a field of view of the detection unit during imprinting, and perform an alignment between the substrate and the original by the driving unit based on the first alignment mark and the second alignment mark detected by the detection unit.

Further features of the present invention will become apparent from the following description of exemplary embodiments with reference to the attached drawings.

DESCRIPTION OF THE EMBODIMENTS

Figure 1:
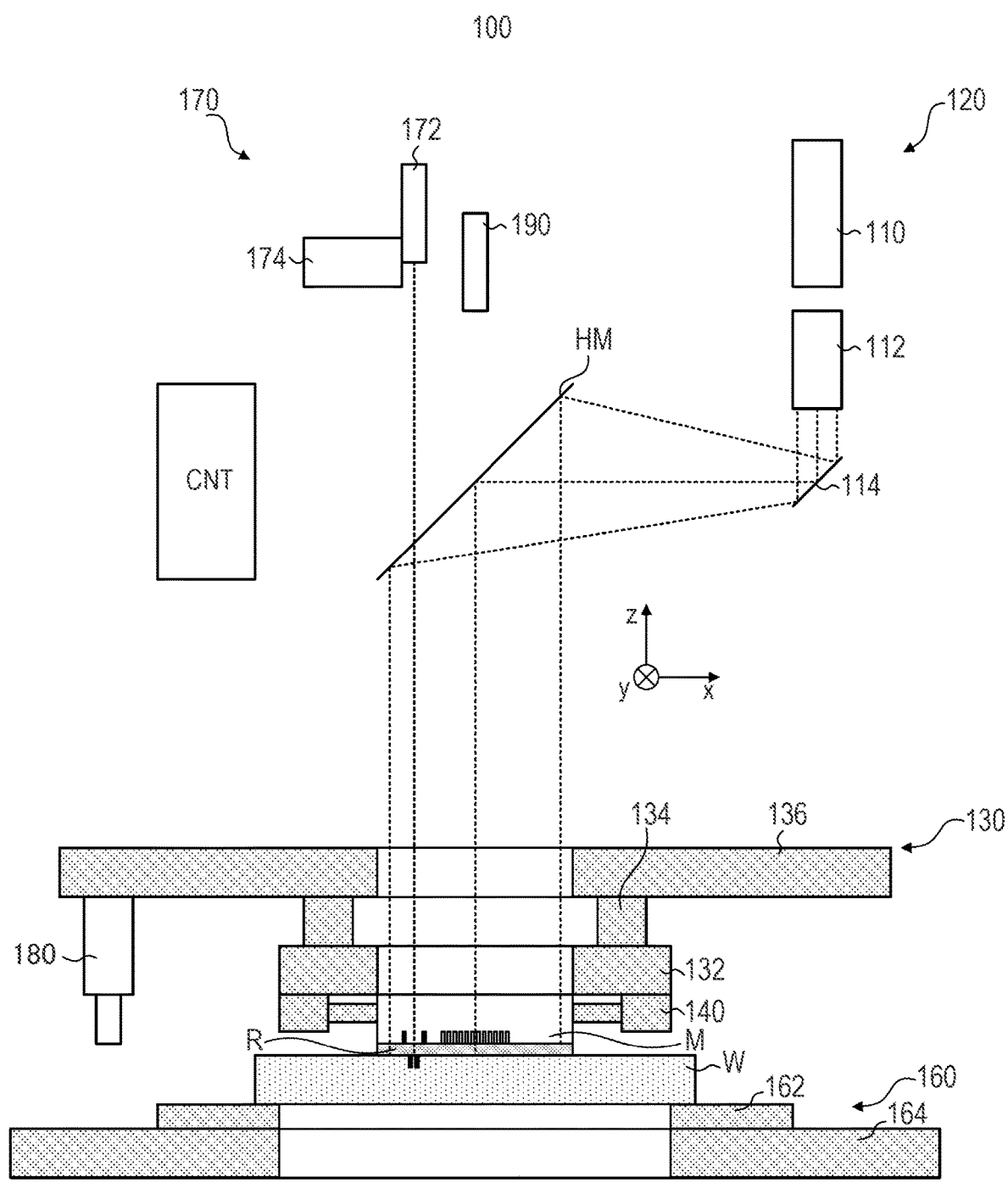
FIG. 1 is a diagram illustrating an imprint apparatus according to a first embodiment.

Hereinafter, preferred embodiments of the present invention will be described in detail with reference to the accompanying drawings. In the drawings, the same members or elements are denoted by the same reference numerals, and overlapping description will be omitted. In addition, it should be noted that the drawings described below may be drawn a scale different from an actual scale in order to facilitate understanding of the present embodiment.

First Embodiment

An imprint apparatus according to an exemplary embodiment of the present invention will be described with reference to FIG. 1. Here, as an example, an example in which the present invention is applied to a UV light curing type imprint apparatus that cures resin by irradiation with UV light (ultraviolet light) will be described. However, the present invention can also be applied to an imprint apparatus that cures a resin by irradiation with light in another wavelength range or an imprint apparatus that cures a resin by another energy (for example, heat).

The imprint apparatus 100 according to the exemplary embodiment of the present invention is configured to form patterns in a plurality of shot regions S on a substrate by repeating an imprint cycle. Here, one imprint cycle is a cycle of forming a pattern in one shot region S of a substrate by curing a resin in a state in which an original (mold) M is pressed against the resin.

The imprint apparatus 100 can include, for example, an exposure mechanism 120, an original operation mechanism 130, an original shape correction mechanism 140, a substrate driving unit 160, an alignment mechanism 170, and a control unit CNT.

The exposure mechanism 120 irradiates a resin (resist) R with ultraviolet light via the original M to cure the resin R. The resin R is an ultraviolet light curing resin in this embodiment. The exposure mechanism 120 includes, for example, a light source unit 110 and an optical system 112. The light source unit 110 can include, for example, a light source such as a halogen lamp that generates light including ultraviolet light (for example, i-line or g-line), and an optical system such as an elliptical mirror that condenses light generated in the light source.

The optical system 112 includes a lens for irradiating the resin R in the shot region S with light for curing the resin R, and may be configured to include the half mirror HM, the mirror 114, and the like. The optical system 112 may include an optical integrator in order to uniformly illuminate the original M.

The light whose range is defined by the aperture enters the resin R on the substrate W via the imaging system and the original M.

The shot entire region observation scope 190 is a scope for observing the entire shot region S, and is used to confirm the state of imprinting and the progress of imprinting and filling.

In order to transmit ultraviolet light for curing the resin R, the original M is formed of a material transparent at the wavelength of the ultraviolet light, for example, quartz. The original M can be conveyed by an original conveyance mechanism (not shown). The original transport mechanism includes, for example, a transport robot having a chuck such as a vacuum chuck.

The original operation mechanism 130 can include, for example, an original chuck (original support unit) 132 that supports the original M, an original driving mechanism 134 that drives the original M by driving the original chuck 132, and an original base 136 that supports the original driving mechanism 134.

The original driving mechanism 134 includes a positioning mechanism that controls the position of the original M with respect to the six axes, and a mechanism that presses the original M against the substrate W or the resin R thereon and separates the original M from the cured resin R. Here, the six axes are an X axis, a Y axis, and a Z axis in an XYZ coordinate system in which a support surface (a surface supporting the original M) of the original chuck 132 is an XY plane and a direction orthogonal to the XY plane is a Z axis, and rotations around the respective axes.

The original shape correction mechanism (shape correction unit) 140 can be mounted on the original chuck 132. The original shape correction mechanism 140 can correct the shape of the original M by applying pressure to the original M from the outer periphery using a cylinder that operates with a fluid such as air or oil. Alternatively, the original shape correction mechanism 140 includes a temperature control unit that controls the temperature of the original M, and corrects the shape of the original M by controlling the temperature of the original M.

The substrate W can be deformed (typically, expanded or shrinked) by undergoing a process such as heat treatment. The original shape correction mechanism 140 corrects the shape of the original M in accordance with such deformation of the substrate W so that an overlay (alignment) error falls within an allowable range.

The coating mechanism 180 sequentially applies the resin R to regions of the substrate W where imprinting is to be performed, or collectively applies the resin R to the entire surface of the substrate W. Although the coating mechanism 180 configured in the imprint apparatus 100 may be used, batch coating may be performed by an external apparatus. The coating mechanism 180 can include, for example, a tank that stores the resin R, a nozzle that discharges the resin R supplied from the tank through a supply path to the substrate W, a valve provided in the supply path, and a supply amount control unit.

Next, the original M is pressed against the resin R, and the resin R is cured by being irradiated with ultraviolet light in this state. Next, the same processing is executed for the next shot region S.

The substrate driving unit 160 can include, for example, a substrate chuck (substrate support unit) 162 having a mounting surface that supports the substrate W, a substrate stage 164 that drives the substrate W by driving the substrate chuck 162, and a stage driving mechanism (not shown).

The stage driving mechanism can include a positioning mechanism that controls the position of the substrate W by controlling the position of the substrate stage 164 with respect to the six axes described above.

The alignment mechanism 170 can include, for example, an alignment scope (detection unit) 172 and an alignment stage mechanism 174.

The alignment scope 172 can include an automatic adjustment scope (AAS) that aligns the original M and the shot region S of the substrate W. The alignment scope 172 detects an alignment mark AMM formed on the original M and an alignment mark (second alignment mark) AMW formed on the substrate W via the original M. Although only one alignment mechanism 170 is shown in FIG. 1, a plurality of alignment mechanisms are mounted.

The imprint apparatus 100 further includes a surface plate and a vibration isolator (damper) (not shown).

The surface plate supports the entire imprint apparatus 100 and forms a reference plane when the substrate stage 164 moves.

The vibration isolator removes vibrations from the floor and supports the surface plate.

Figure 3:
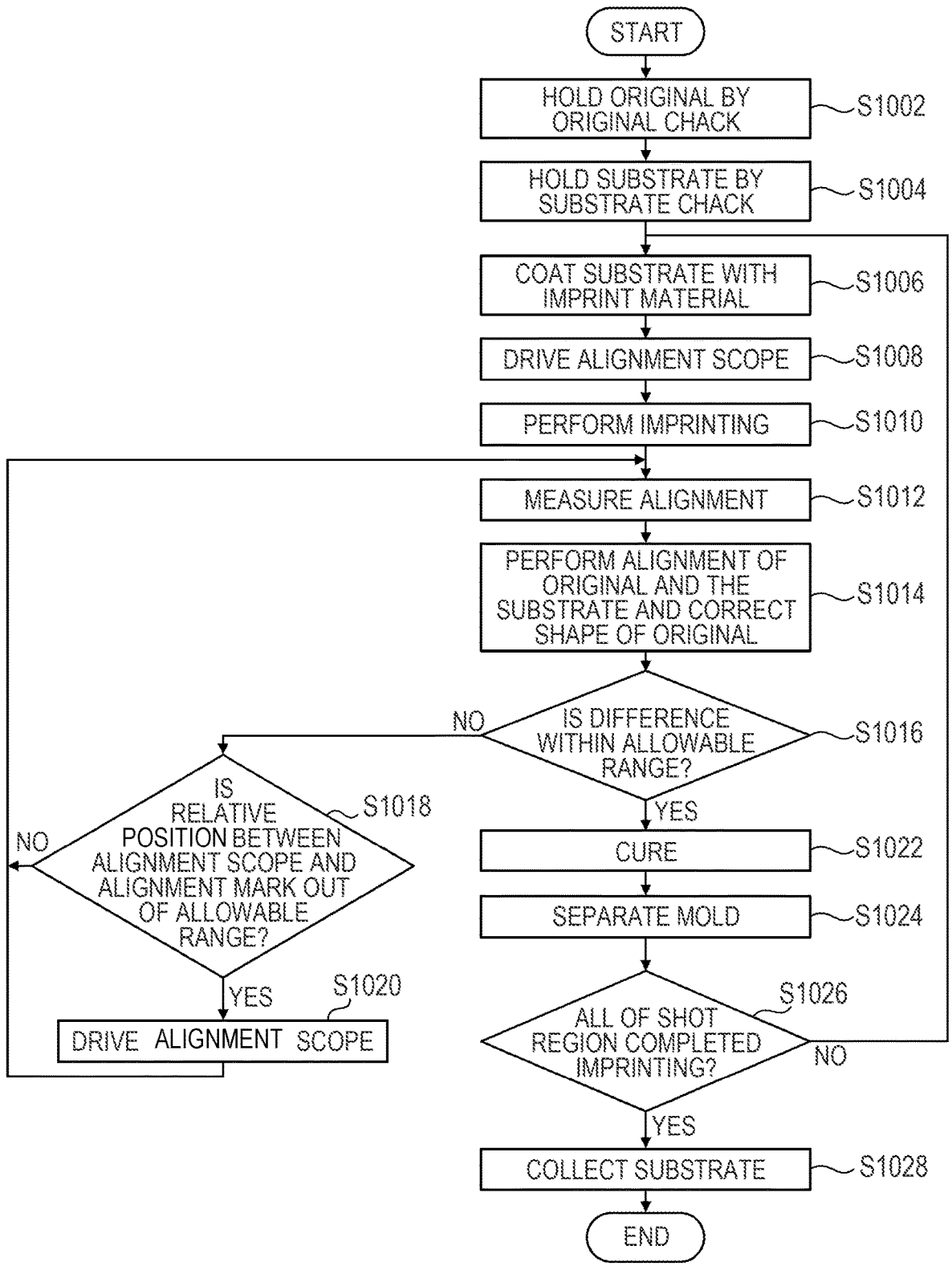
FIG. 3 is a flowchart of the imprinting method according to the first embodiment.

The operation of the imprint apparatus 100 will be described below with reference to FIG. 3. This operation is controlled by the control unit CNT in this embodiment.

First, the original M is conveyed to the original chuck 132, positioned, and held by the original chuck 132 (step 1002).

Next, in step 1004, the substrate W is loaded onto the substrate chuck 162 by a transport mechanism (not shown) and held by the substrate chuck 162. Here, it is assumed that at least one layer of pattern has already been formed on the substrate W together with the alignment marks AMW.

Figure 2:
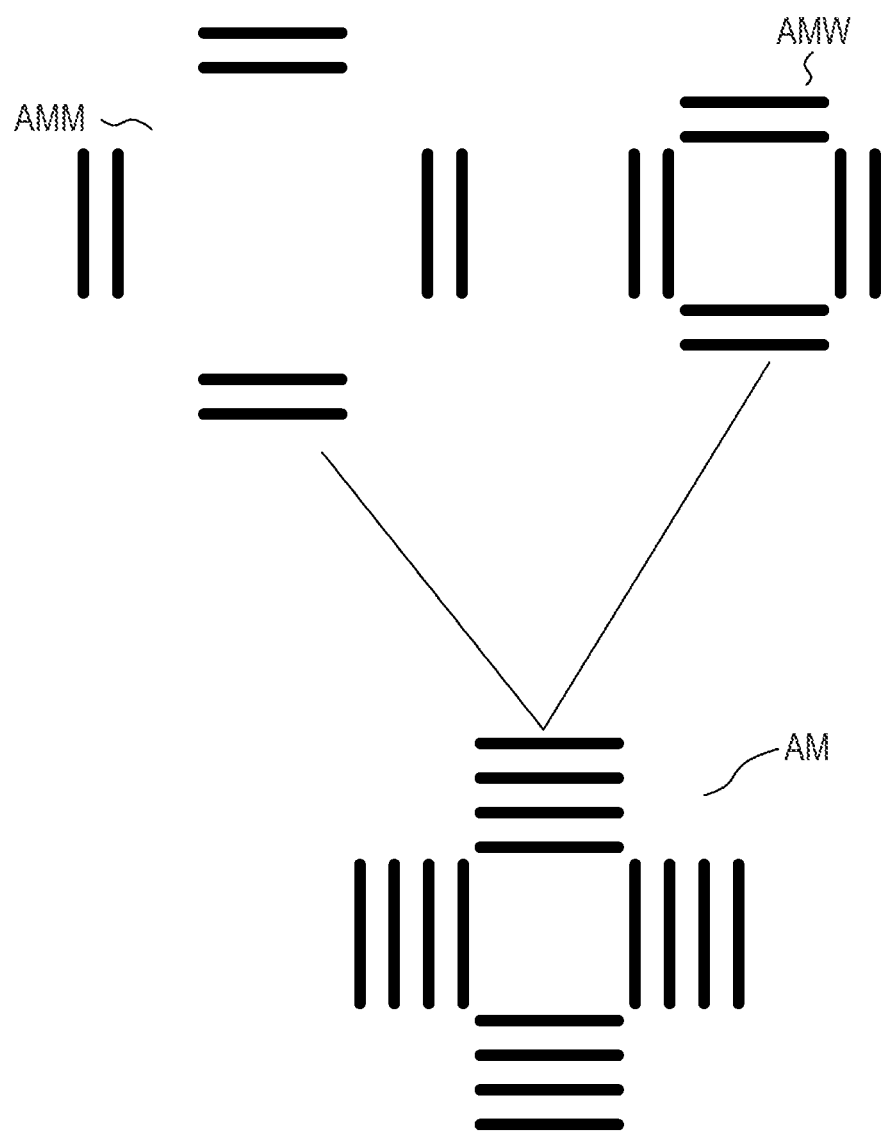
FIG. 2 is a diagram showing an example of an alignment mark.
Figure 4:
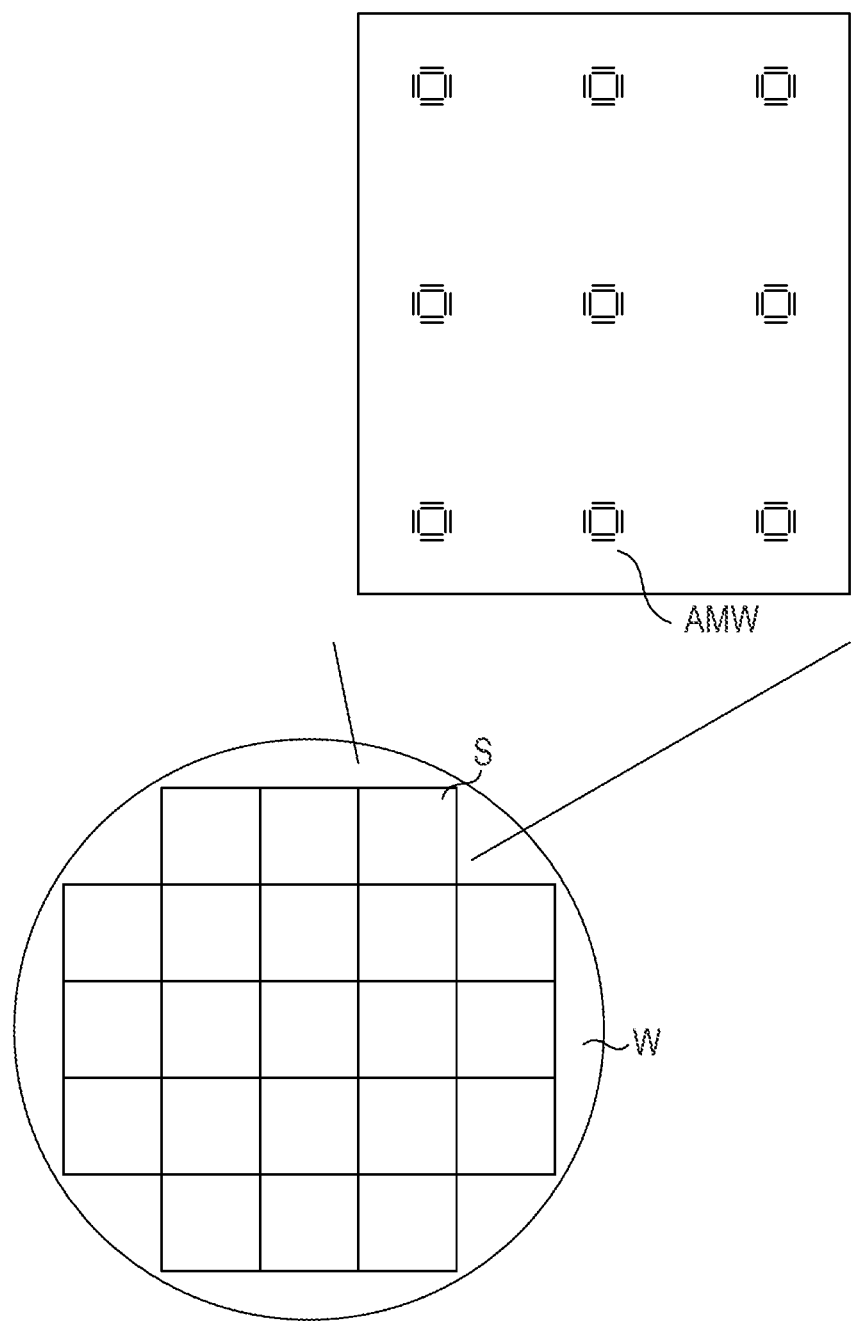
FIG. 4 is a diagram showing an example of the arrangement of substrates and shots.

FIG. 2 illustrates alignment marks AMM, AMW formed on the original M and the substrate W. The alignment mark (first alignment mark) AMM on the original M and the alignment mark AMW on the substrate W are configured in shapes that do not completely overlap each other, and it is possible to measure the relative position with the alignment mark AMW of the substrate W through the original M. The relative position between the alignment scope 172 and the alignment mark AMM or AMW (also referred to as alignment mark AM) can also be measured by measuring the positions of the alignment marks AMM and AMW within the field of view of the alignment scope 172. As shown in FIG. 4, a plurality of shot regions S are formed on the substrate W, and a plurality of alignment marks AMW are formed in each shot region S.

Next, in step 1006, the coating mechanism 180 applies the resin R onto the region to be imprinted. The resin R may be applied to the entire surface of the substrate W in advance using an external device.

Next, in step 1008, the alignment scope 172 is driven to the position of the alignment mark AMM on the original M by the alignment stage mechanism (position adjustment unit) 174.

Next, in step 1010, the original M is lowered by the original operation mechanism 130 to press (imprint) the original M against the substrate W or the resin R. Here, instead of driving the original M so as to descend, the substrate W may be raised so that the original M is pressed against the resin R. The pressing load can be controlled using, for example, a load sensor built in the original driving mechanism 134.

Subsequently, in step 1012 and subsequent steps, alignment measurement is performed according to the die-by-die alignment method during imprinting. To be specific, the alignment marks AMM, AMW of the original M and the substrate W are imaged by the alignment scope 172, and the relative position between the alignment marks AMM, AMW of the original M and the substrate W are measured by an image processing apparatus (not shown). Based on the result of the relative position measurement between the alignment marks AMM, AMW, the difference in shot shape between the original M and the substrate W (coordinates, rotation, magnification, trapezoidal formation, and the like) is measured.

Next, in step 1014, alignment is performed based on the result of relative position measurement between the alignment marks AMM, AMW during imprinting. At the same time, if necessary, the shape of the original M is corrected (deformed) by the original shape correcting mechanism 140 in order to match the original M with the shot shape of the substrate W.

In the shape correction of the original M by the original shape correcting mechanism 140, a correction error occurs due to a driving error or the like of the original shape correcting mechanism 140. Therefore, in step 1016, an allowance determination of the shot shape difference between the original M and the substrate W is carried out.

If it is determined in step 1016 that the shot shape difference between the original M and the substrate W is out of the allowable range, alignment measurement is performed again. However, before that, it is determined whether or not the relative position between the field of view of the alignment scope 172 and the alignment mark AM is outside the allowable range (outside the first range) (step 1018).

If the determination result in step 1018 is out of the allowable range, the alignment scope 172 is driven to perform relative alignment between the field of view of the alignment scope 172 and the alignment mark AM (step 1020).

Figure 5:
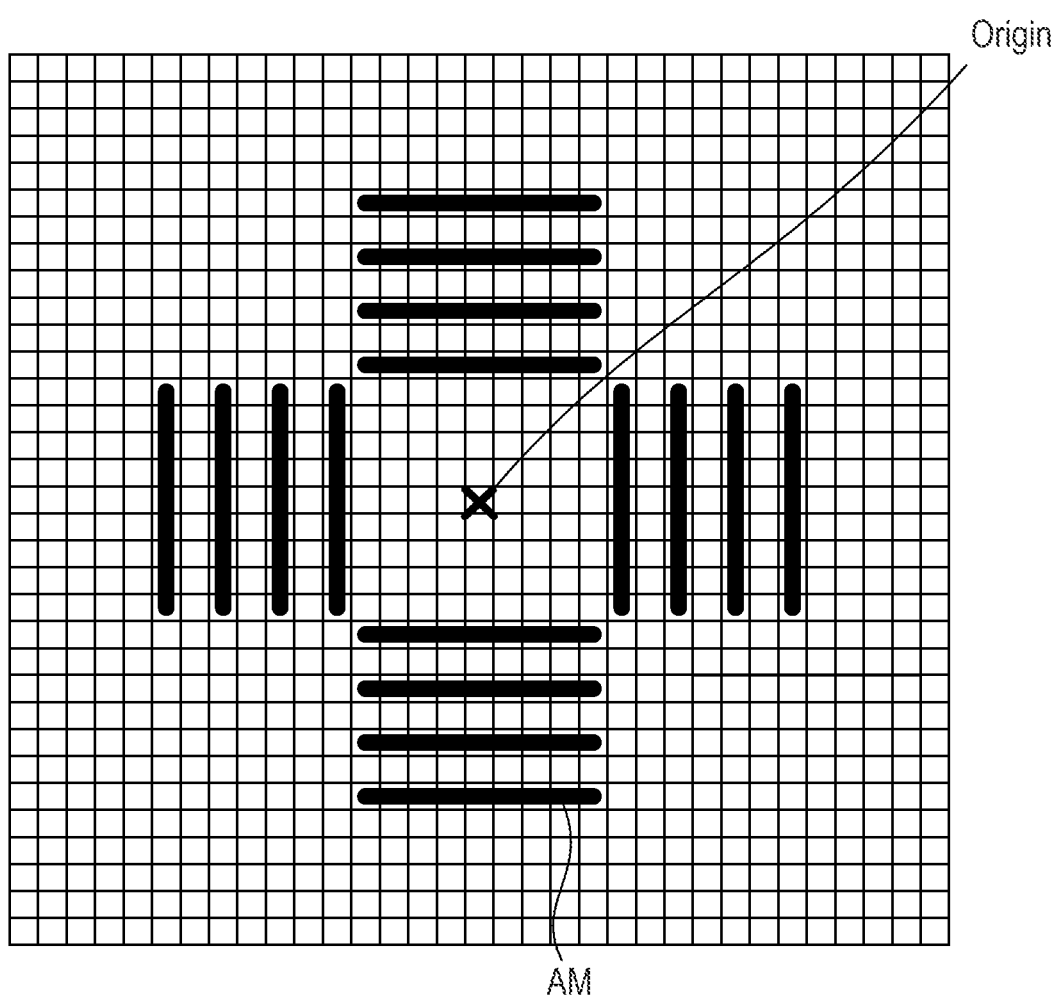
FIG. 5 is a diagram of an alignment mark in a field of view of an alignment detection system.

FIG. 5 is a diagram showing the inside of the field of view of the alignment scope 172. The alignment stage mechanism 174 drives the alignment scope 172 to adjust the relative position so that the alignment mark AM is always positioned at the reference point (origin) of the field of view. A plurality of alignment mechanisms 170 are mounted, and the relative positions of the alignment marks AM and the alignment scopes 172 are individually adjusted. Here, the alignment mark AM being positioned at the reference point of the field of view refers to a state in which the regions of the alignment mark AMM and the alignment mark AMW are in a positional relationship (within a first allowable range) overlapping the reference point of the field of view. More preferably, the positional relationship (within the first allowable range) is such that the distance between the center of the alignment mark AM and the reference point of the field of view is 5% or less, preferably 2% or less, and more preferably 1% or less of the minimum diameter of the field of view of the alignment scope 172.

After the relative position between the field of view of the alignment scope 172 and the alignment mark AM is adjusted, alignment measurement is performed again by the alignment scope 172. Based on the measurement result, shape correction is performed on the original M until the difference between the shot shapes of the original M and the substrate W falls within a predetermined allowable range (within a second allowable range).

After that, when the residual falls within the allowable range, curing of the resin R as the imprint material is started (step 1022). The curing of the resin R is performed by irradiating the resin R with ultraviolet light via the original M using the exposure mechanism 120.

In this way, in parallel with the step of performing imprinting, the detected alignment mark AMW of the substrate and the detected alignment mark AMM of the original are detected, and alignment between the substrate W and the original M is performed based on the detected alignment mark AM.

When the curing of the resin R is completed, next, in step 1024, the original M is separated from the cured resin R by raising the original M by the original operation mechanism 130 (mold release). Here, the substrate W may be lowered instead of driving the original M.

In step 1026, it is determined whether imprinting on all the shot regions S of the substrate W has been completed. If there is a shot region S for which imprinting has not been performed, the process returns to step 1006, and the above-described process is repeated for the next shot region S. On the other hand, if imprinting has been completed for all the shot regions S, the substrate W is unloaded from the substrate chuck 162 by a transport mechanism (not shown) in step 1028.

In the present embodiment, when the relative position between the alignment scope 172 and the alignment mark AM is out of the allowable range in the determination in step 1018, the alignment scope 172 is driven to adjust the relative positions. However, the present invention is not limited thereto. It is also possible to perform driving control so that the relative position of the alignment scope 172 and the alignment mark AM are always aligned without performing determination with respect to the allowable condition. In addition, what is driven is not limited to the alignment scope 172, and the original M may be moved by the original driving mechanism 134.

In addition, although it has been described that the curing of the resin R (step 1022) is performed when the residual error of the alignment in step 1014 can be brought into the allowable range, the curing may be started when a predetermined time elapses. When the process time exceeds the initially planned process time due to the driving of the alignment scope 172 or the like, the process time may be extended.

<Embodiment of Method for Manufacturing Article>

A method for manufacturing a device (a semiconductor integrated circuit element, a liquid crystal display element, or the like) as an article includes steps of forming a pattern on a substrate (a wafer, a glass plate, or a film-like substrate) using the above-described imprint apparatus.

The manufacturing method may further include a step of etching the substrate on which the pattern is formed.

When another article such as a patterned medium (recording medium) or an optical element is manufactured, the manufacturing method may include another process of processing a substrate on which a pattern is formed instead of etching process.

The method for manufacturing an article according to the present embodiment is advantageous in at least one of performance, quality, productivity, and production cost of the article as compared with a conventional method.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

Although the embodiments of the present invention have been described above, the present invention is not limited to these embodiments, and various modifications and changes can be made without departing from the scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-147508, filed Sep. 10, 2021, which is hereby incorporated by reference herein in its entirety.

What is claimed is:

1. An imprint apparatus that forms a pattern by imprinting an imprint material on a substrate using an original, comprising:
    an original support unit configured to support the original;
    a substrate support unit having a mounting surface configured to support the substrate;
    a driving unit configured to relatively drive the original support unit and the substrate support unit, the driving unit including a first driving unit configured to drive the original support unit and a second driving unit configured to drive the substrate support unit;
    a detection unit configured to detect a first alignment mark of the original and a second alignment mark of the substrate;
    a position adjustment unit configured to adjust a relative position between the original and the detection unit; and
    a control unit configured to control the position adjustment unit to adjust a relative position between the original and the detection unit based on a position of the first alignment mark, detected by the detection unit, in a field of view of the detection unit during imprinting,
    wherein when the position of the first alignment mark detected by the detection unit is outside a first allowable range, the control unit drives the position adjustment unit to perform an adjustment so that the first alignment mark falls within the first allowable range, then after performing the adjustment, the control unit controls the driving unit to perform an alignment between the substrate and the original based on the relative position of the first alignment mark and the second alignment mark detected by the detection unit.

2. The imprint apparatus according to claim 1, further comprising a shape correction unit configured to deform a shape of the original,
    wherein after the adjustment is performed such that the first alignment mark falls within the first allowable range,
    the shape correction unit performs a shape correction on the original until a difference between shot shapes of the original and the substrate falls within a second allowable range,
    the detection unit performs a detection of the first alignment mark and the second alignment mark when the difference between the shot shapes of the original and the substrate falls within the second allowable range, and
    the control unit performs an alignment between the substrate and the original based on a result of the detection.

3. The imprint apparatus according to claim 2, wherein the control unit ends the alignment when a predetermined process time elapses.

4. The imprint apparatus according to claim 2, wherein the control unit performs the alignment by extending a predetermined process time when the relative position between the first alignment mark and the second alignment mark does not fall within the second allowable range even by driving at least one of the original support unit and the substrate support unit by the driving unit.

5. The imprint apparatus according to claim 1, further comprising a shape correction unit configured to deform a shape of the original,
    wherein when performing the alignment, the control unit is configured to control the driving unit to adjust the relative position between the first alignment mark and the second alignment mark and is configured to control the shape correction unit to change a shape of the original.

6. The imprint apparatus according to claim 1, wherein the position adjustment unit adjusts the relative position between the original and the detection unit by moving the detection unit.

7. The imprint apparatus according to claim 1, wherein the control unit adjusts the relative position between the original and the detection unit by controlling the first driving unit to move the original support unit.

8. The imprint apparatus according to claim 1,
    wherein when the position of the second alignment mark detected by the detection unit is outside the first allowable range, the control unit drives the position adjustment unit to perform an adjustment so that the second alignment mark falls within the first allowable range, then after performing the adjustment, the control unit controls the driving unit to perform the alignment between the substrate and the original based on the relative position of the first alignment mark and the second alignment mark detected by the detection unit, and
    wherein the falling within the first allowable range refers to a case where a distance between a center of the first alignment mark and a reference point of a field view of the detection unit and a distance between a center of the second alignment mark and the reference point are 5% or less of a minimum diameter of the field of view of the detection unit.

\* \* \* \* \*